(12) United States Patent
Savelli et al.

(10) Patent No.: US 6,754,474 B1
(45) Date of Patent: *Jun. 22, 2004

(54) RADIO TRANSMISSION SYSTEM

(75) Inventors: Patrick Savelli, Paris (FR); Vassiliki Nikolopoulou, Paris (FR)

(73) Assignee: Alcatel, Paris (FR)

( * ) Notice: Subject to any disclaimer, the term of this patent is extended or adjusted under 35 U.S.C. 154(b) by 343 days.

This patent is subject to a terminal disclaimer.

(21) Appl. No.: 09/621,815

(22) Filed: Jul. 21, 2000

(30) Foreign Application Priority Data

Jul. 22, 1999 (FR) .......................................... 99 09536

(51) Int. Cl.[7] .................................................. H04B 1/04
(52) U.S. Cl. ............................ 455/113; 455/76; 455/91
(58) Field of Search ............................... 455/84, 85, 86, 455/87, 76, 112, 118, 67

(56) References Cited

U.S. PATENT DOCUMENTS

| | | | | |
|---|---|---|---|---|
| 4,449,250 A | * | 5/1984 | Kurby .......................... 455/76 |
| 4,816,774 A | * | 3/1989 | Martin ........................ 331/1 A |
| 5,038,117 A | * | 8/1991 | Miller .......................... 331/16 |
| 5,055,802 A | | 10/1991 | Hietala et al. |
| 5,111,162 A | | 5/1992 | Hietala et al. |
| 5,128,633 A | | 7/1992 | Martin et al. |
| 5,337,024 A | * | 8/1994 | Collins ......................... 332/127 |
| 5,493,583 A | * | 2/1996 | Cripps .......................... 375/219 |
| 5,714,896 A | * | 2/1998 | Nakagawa et al. .......... 327/115 |
| 5,740,521 A | * | 4/1998 | Hulkko et al. ................ 455/76 |
| 5,790,601 A | * | 8/1998 | Corrigan, III et al. ....... 375/302 |
| 5,900,785 A | * | 5/1999 | Freed ........................... 331/10 |
| 5,903,194 A | * | 5/1999 | Opsahl et al. .............. 331/1 A |
| 5,995,812 A | * | 11/1999 | Soleimani et al. ........... 455/119 |
| 6,141,394 A | * | 10/2000 | Linebarger et al. .......... 375/376 |
| 6,370,360 B1 | * | 4/2002 | Kunkel .......................... 455/76 |
| 6,441,690 B1 | * | 8/2002 | Savelli et al. ............... 331/1 A |
| 6,452,909 B1 | * | 9/2002 | Bauer ........................... 370/280 |

FOREIGN PATENT DOCUMENTS

| | | | |
|---|---|---|---|
| EP | 0 125 811 A2 | 11/1981 | |
| EP | 0 408 238 A2 | 1/1991 | |
| EP | 90307270 | * 1/1991 | ............ H03C/3/09 |

* cited by examiner

Primary Examiner—William Trost
Assistant Examiner—James D. Ewart
(74) Attorney, Agent, or Firm—Sughrue Mion, PLLC

(57) ABSTRACT

In a transmission system, a modulator and a fractional frequency divider are introduced into the control loop of a voltage-controlled oscillator. It is shown that the benefit of this is a reduction in noise associated with the reduction of noise due to using a divider with a lower division coefficient. In one embodiment, the fractional divider is obtained by selecting different dividers in turn in accordance with temporal proportions corresponding to a required division fraction.

19 Claims, 1 Drawing Sheet

RADIO TRANSMISSION SYSTEM

The present invention relates to a radio transmission system usable mainly in the mobile telephone art. Other uses are feasible, however. The object of the invention is to reduce the cost of equipment by simplifying its design.

BACKGROUND OF THE INVENTION

Having radio transmit and receive circuits use a common set of local oscillators is known in the art, in particular in the mobile telephone art. Systems using two or three local oscillators are also known in the art. For example, the phase of a signal at an intermediate frequency of the order of 100 MHz produced by a first local oscillator is compared to the phase of a signal produced by a transition local oscillator. The frequency of either or both signals is divided before their phases are compared.

The signal from the phase comparator controls a voltage-controlled third oscillator referred to as the transmission oscillator. Although one of the intermediate frequency and transition frequency local oscillators preferably produces fixed frequency signals and the other produces variable frequency signals, the voltage-controlled local oscillator produces a signal whose frequency varies as a function of the comparison signal. This frequency variation is exploited in the mobile telephone art to provide frequency agility, which changes the frequency of a transmission channel from one transmit or receive frame to the next. To give a more concrete idea of this, the GSM 900 MHz system and the DCS 1800 MHz system have a channel width of 200 kHz.

Frequency agility is achieved by dividing the frequency of the loop signals and of the intermediate frequency signals.

A standard system of the above kind has a number of particular features. Firstly, the need for dual-band mobile telephones, i.e. mobile telephones able to operate in the GSM 900 MHz band and in the DCS 1800 MHz band, can make it necessary to double the number of local oscillators. Accordingly, if no precautions were taken, this could lead to systems with six local oscillators. The cost of such equipment would be excessive. Also, for stable control, the principle of controlling the third local oscillator by means of a signal from a phase comparator requires a loop filter which does not diverge. Although the loop includes a filter of this kind, naturally disposed between the phase comparator and the voltage-controlled oscillator, it also has distributed filtering characteristics which give it a low-pass transfer function with a cut-off frequency slightly different from the cut-off frequency of the filter, although of the same order of magnitude.

The loop cut-off frequency is an important parameter. As it is reduced, the loop becomes more stable but is less able to change state quickly for the frequency hops that provide frequency agility. Furthermore, if there is a requirement to modulate the signal before it enters the loop, this is possible only if the bandwidth of the filter is not too narrow, so that it can pass GMSK modulation. A compromise is therefore required. Furthermore, the presence in the loop of a mixer combining signals from the third local oscillator with signals from the second local oscillator produces mixing noise which propagates in the loop, and as a result the signal from the third local oscillator is noisy. Noise at frequencies close to the carrier frequency is filtered out by the loop, but harmonics are not. Also, the filter damps harmonics of the comparison frequency of the phase comparator. A compromise is therefore required in respect of the filter. This compromise is equivalent to increasing the loop bandwidth to change state faster and decreasing it to eliminate the noise components referred to above.

Of course, a transmitter of the above kind does not merely transmit a carrier signal. It is intended to transmit a carrier signal which has been modulated by a modulation signal. Various solutions to the problem of transmitting the modulation signal in the form of modulation of the transmitted carrier signal can be considered.

A first solution consists of having the modulation signal modulate the intermediate frequency signal before it is fed into the phase comparator. The drawback of that solution is that it requires a large number of local oscillators. The local oscillators cannot be integrated into an integrated circuit including the transmitter system, they complicate its construction, and they increase its overall size. Also, local oscillators are relatively costly.

In another solution, the carrier is modulated in the control loop. In this case, a modulator is placed between the third local oscillator, which produces the transmit frequency, and the second oscillator, which produces the transition frequency. In theory, a modulator of this kind includes a mixer based on a non-linear circuit. Non-linear circuits have the drawback of producing a great deal of noise in addition to modulation. Also, the need to increase the bandwidth of the loop to pass the modulation means that the noise is filtered less and the phase error of the transmitter is increased. The noise is further increased by the presence of the dividers needed for frequency agility.

The higher the loop division coefficients, the more noise is produced. Dividers which divide by 9000 or by 4500 to produce signals at frequencies of the order of 200 kHz, comparable to an intermediate frequency signal, are known in the art.

OBJECTS AND SUMMARY OF THE INVENTION

The invention seeks to solve the noise problem whilst reducing the number of local oscillators needed. These two effects are obtained simultaneously simply by replacing the mixers or dividers in the loop, which have high coefficients to enable reduction of the frequency, with fractional dividers which then enable the comparator to compare a first signal whose frequency has been divided in this way and a second signal at an intermediate frequency, which is preferably a frequency higher than those used in the prior art. In one particularly judicious instance, this leads to the use of a single local oscillator, the intermediate frequency oscillator merely consisting of a very stable 13 MHz clock which is already available in an integrated circuit which includes the transmission system.

Secondly, the solution of the invention does not call for modulation index division, which would require pre-amplification of the modulation signal, since the transmission signal is modulated directly in the control loop before frequency division. This automatically reduces the resolution of the digital part of the system and therefore simplifies the processing circuits and the control logic circuits.

Also, it can be shown that a fractional divider produces only noise that is related to the integer part of the division coefficient and is therefore at a significantly lower level than the noise produced by dividers with a high coefficient, by a ratio of approximately 1 to 30. Accordingly, the presence in the loop of the low-pass filter with a cut-off frequency of approximately 200 kHz is sufficient to eliminate residual noise and to comply with the standards. Accordingly, increasing the loop bandwidth is not detrimental to noise performance (there is no increase in the phase error). With the synthesizer of the invention, a greater loop bandwidth can be retained, which is beneficial because it procures a higher switching or hopping rate for frequency agility.

The invention therefore provides a radio transmission system including, in a phase control loop, a voltage-controlled oscillator producing a signal to be transmitted, a modulator modulating the signal to be transmitted by a modulation signal to produce a modulated signal, and a phase comparator receiving on a phase input a signal representative of the modulated signal and on a second input a reference signal at an intermediate frequency, wherein the control loop includes a fractional frequency divider between the modulator and the comparator.

BRIEF DESCRIPTION OF THE DRAWING

The invention will be better understood on reading the following description and examining the accompanying drawing. The drawing is provided by way of non-limiting example of the invention.

MORE DETAILED DESCRIPTION

Figure 1:
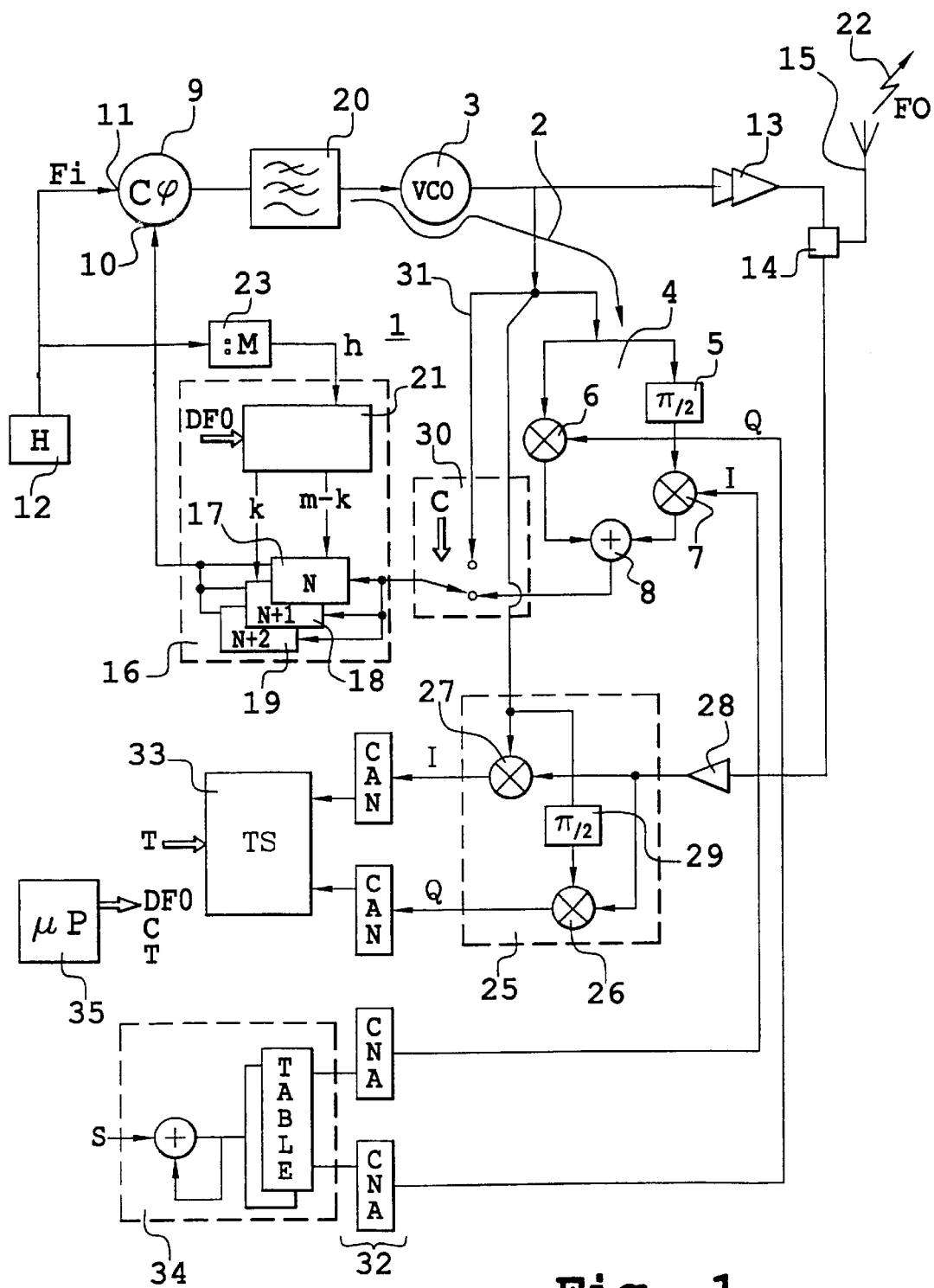
FIG. 1 shows a radio transmission system of the invention.

FIG. 1 shows a radio transmission system 1. The system includes a control loop 2. The loop 2 essentially includes a voltage-controlled oscillator 3. For example, the oscillator 3 can produce a signal at a frequency of the order of 1800 MHz conforming to the DCS standard. Oscillators are nevertheless feasible with a range of frequencies which preferably enable transmission in the 900 MHz band (corresponding to the GSM standard) or in the 1900 MHz band (corresponding to the PCS standard), or even at higher frequencies, i.e. at 2200 MHz, corresponding to the UMTS standard. The loop 2 also includes a modulator 4. The modulator 4 modulates the transmission signal produced by the oscillator 3.

To this end, the modulator 4 conventionally includes a first phase-shifter 5 which applies a phase-shift of π/2 to provide, in addition to the signal direct from the oscillator, the same signal phase-shifted by π/2. The two signals are applied to first inputs of respective mixers 6 and 7 which receive on respective second inputs modulation signals I and Q which are known in the art. The outputs of the mixers 6 and 7 are connected to two inputs of an adder 8 producing the signal from the oscillator 3 modulated by the signals I and Q. An output of the adder 8 is connected to a phase comparator 9.

The comparator 9 receives on a first input 10 the signal from the adder 8 and on a second input 11 an intermediate frequency reference signal produced by a generator 12. The generator 12 is preferably a very stable 13 MHz clock of an integrated circuit in which the transmission system is implemented and which is also used to time the operation of a general processor circuit (see below). Accordingly, there is no need to provide a local oscillator specifically for the generator 12.

For the circuit 1 to operate as a transmission circuit the output of the oscillator 3 is conventionally connected to a power amplifier 13 whose output is connected to a transmit antenna 15 via a duplexer 14, i.e. a simple transmit/receive switch.

According to an essential feature of the invention, a fractional frequency divider 16 is placed between the modulator 4 and the comparator 9. One example of the fractional divider 16 includes a set of divider units 17, 18 (and even 19) which are respectively adapted to multiply the signal from the adder 8 by an integer fraction of coefficient N or by another integer fraction of different coefficient N+1 (or even N+2, or some other coefficient). It can be shown that if the signal from the modulator 4 is divided with a coefficient N in a particular period and with a coefficient N+1 in another period, a signal is obtained whose average frequency is between those resulting from the two integer divisions. Thus fractional division is achieved. For the instantaneous frequency produced to be equal to the average frequency, the switching period if made relatively short. In practice the switching frequency is higher than the low-pass cut-off frequency of the loop 2, which is of the same order of magnitude as the low-pass cut-off frequency of a low-pass filter 20 between the comparator 9 and the oscillator 3. Switching is controlled by a control circuit 21 which receives a clock signal h and data DF0 relating to the frequency F0 of a radio signal 22 transmitted by the antenna 15. The clock signal h can be derived from the generator 12 by a divider 23 which divides by M, for example by 5 or 10. The frequency of the signal h is between the frequency of the signal from the clock 12 and the cut-off frequency of the loop 2, and therefore of the filter 20.

A numerical example of the operation of the fractional divider 16 follows, with the intention of simplifying the explanation. It is necessary for the fractional divider 16 to produce signals at 13 MHz comparable to those produced by the clock 12 from a 1800 MHz signal produced by the oscillator 3. The required division coefficient has an integer part 138 and a fractional part. To provide the frequency agility required of the oscillator 3, the standard imposes frequency hops of 200 kHz. Starting from a comparison signal at 13 MHz, a band of 200 kHz is obtained by dividing 13 MHz by 65. Under these conditions the fractional divider must be able to divide using a coefficient with the value 138+k/65. The coefficient can be written in the following manner:

$$138 + k/65 = 138 + (k*139 - k*138)/65$$
$$= 65*138/65 + k*139/65 - k*138/65$$
$$= ((65 - k)*138 + k*139)/65$$

This can be written:

$$((n-k)*N + k*(N+1))/n$$

In this last formula, n represents the coefficient by which the value of the intermediate frequency Fi produced by the clock generator 12 must be divided to obtain the required channel width for the frequency hopping increments, i.e. 200 kHz in this instance, starting from 13 MHz. In the above formula, N denotes the integer part of the ratio of the frequency F0 to be produced to the intermediate frequency Fi. In practice, the control circuit 21 uses a divider unit, for example the divider unit 17 which divides by N, in the loop during a period k and another divider unit during a period (m−k). In fact, the same divider can be used with division coefficients which have the values N, N+1, N+2. The period m is the reciprocal of the frequency of the signal h. If the frequency hops must extend beyond an integer part of the frequency of the clock signal 12, the divider unit which divides by 139, i.e. (N+1) can be replaced by a divider unit which divides by 140, i.e. (N+2), or even by N+I where I is an integer.

To simplify the explanation of the circuit 21, imagine that the divider 18 operates k times for every (m−k) operations of the divider 17, and so on at the rate of the oscillations of the signal h. Other implementations are possible in which, of m operations, k operations of the divider 18 are interleaved with (m−k) operations of the divider 17. Because of the presence of the loop filter, in particular of the filter 20, the fractional frequency F0 is acquired by the oscillator 3, which stabilizes on it. An advantage of the fractional division is that the noise produced is either the noise related to the divider 1 or the noise related to the divider 18: in either case the noise level is low.

Another advantage is that acquisition is faster with a high frequency Fi. The filter 20 can therefore have a higher cut-off frequency, for example a cut-off frequency higher than 200 kHz.

Moreover, the circuit provided by the invention enables the single voltage-controlled oscillator 3 to be used as the only oscillator of a receiver circuit, which then includes a demodulator 25 whose mixers 26 and 27 receive at their first inputs a radio signal received via the antenna 15, selected by the duplexer 14 and pre-amplified by a low-noise pre-amplifier 28. The mixers 26 and 27 receive at their second inputs the signal produced by the local oscillator 3 or that signal phase-shifted by $\pi/2$ in a phase-shifter 29.

In this case, a switch 30 can select either the modulator 4, as envisaged until now, or a short-circuit connection 31 in the control loop of the oscillator 3. Another approach also uses the modulator 4, but the signals I and Q have constant values, for example Q=0 and I=0. The loop 1 then transmits a stable signal at the unmodulated pure frequency F0 and the switch 30 can be omitted.

The modulators 4 and 25 are connected to digital-to-analogue and analogue-to-digital converters 32, respectively. In a manner that is known in the art, these converters are connected to receiver signal processor circuits 33 or transmitter phase accumulation circuits 34 of a type known in the art. All the above circuits are controlled by a microprocessor 35, shown only symbolically here, which includes a program memory. The microprocessor 35 is able to place on a control bus instructions DF0 for controlling the circuit 21 and instructions C for switching between transmission and reception. The instructions C are applied to the switch 30. The microprocessor 35 also produces processing instructions T corresponding to adjustment of the transmission system to conform to frequency hopping and synchronization requirements, in particular in the mobile telephone art.

What is claimed is:

1. A radio transmission system including, in a phase control loop:
    a voltage-controlled oscillator producing a signal to be transmitted;
    a modulator modulating the signal to be transmitted by a modulation signal to produce a modulated signal;
    a phase comparator receiving on a phase input a signal representative of the modulated signal and on a second input a reference signal at an intermediate frequency;
    a fractional frequency divider coupled between the modulator and the comparator, said fractional frequency divider operating based on said intermediate frequency; and
    a switch for selectively connecting the modulator or the voltage controlled oscillator to the fractional frequency divider,
    wherein said voltage-controlled oscillator is coupled for radio signal reception.

2. A system according to claim 1, wherein the fractional frequency divider includes a set of frequency divider units dividing by integer numbers and a selector circuit for selecting the frequency divider units in turn.

3. A system according to claim 2, wherein the divider units have division coefficients which differ by one unit.

4. A system according to claim 2, wherein the selector circuit selects the frequency divider units in turn at a clock frequency between the intermediate frequency and the cut-off frequency of a low-pass filter between the comparator and the oscillator.

5. A system according to claim 4, wherein the low-pass filter has a cut-off frequency higher than 200 kHz.

6. A system according to claim 1, wherein the frequency of the reference signal is 13 MHz.

7. A system according to claim 1, including a receiver and a single voltage-controlled oscillator which is used alternately to transmit and to receive.

8. A radio transmission system including, in a phase control loop:
    a voltage-controlled oscillator producing a signal to be transmitted;
    a modulator modulating the signal to be transmitted by a modulation signal to produce a modulated signal;
    a phase comparator receiving on a phase input a signal representative of the modulated signal and on a second input a reference signal at an intermediate frequency; and
    a fractional frequency divider coupled between the modulator and the comparator, said fractional frequency divider operating based on said intermediate frequency, wherein said voltage-controlled oscillator is coupled for radio signal reception, and wherein the fractional frequency divider includes a set of frequency divider units dividing by integer numbers and a selector circuit for selecting the frequency divider units in turn, and further wherein the selector circuit selects the frequency divider units in turn at a clock frequency between the intermediate frequency and the cut-off frequency of a low-pass filter between the comparator and the oscillator.

9. The system of claim 8, wherein the control loop includes a switch for selectively connecting the modulator or the oscillator to the fractional frequency divider.

10. The system of claim 9, wherein the divider units have divisional coefficients which differ by one unit.

11. The system of claim 9, wherein the low-pass filter has a cut-off frequency higher than 200 kHz.

12. The system of claim 9, wherein the frequency of the reference signal is 13 MHz.

13. The system of claim 9, including a receiver and a single voltage-controlled oscillator which is used alternatively to transmit and to receive.

14. A radio transmission system including, in a phase control loop:
    a voltage-controlled oscillator producing a signal to be transmitted;
    a modulator modulating the signal to be transmitted by a modulation signal to produce a modulated signal;
    a generator producing a reference signal at an intermediate frequency;
    a phase comparator receiving on a phase input a signal representative of the modulated signal and on a second input said reference signal;
    a divider diving said reference signal to produce a clock signal; and
    a fractional frequency divider coupled between the modulator and the comparator, said fractional frequency divider operating based on said clock signal, wherein said voltage-controlled oscillator is coupled for radio signal reception.

15. The system of claim 14, wherein the control loop includes a switch for selectively connecting the modulator or the oscillator to the fractional frequency divider.

16. The system of claim 14, wherein the fractional frequency divider includes a set of frequency divider units dividing by integer numbers and a selector circuit for selecting the frequency divider units in turn.

17. The system of claim 16, wherein the divider units have divisional coefficients which differ by one unit.

18. The system of claim 16, wherein the selector circuit selects the frequency divider units in turn at a clock frequency between the intermediate frequency and the cut-off frequency of a low-pass filter between the comparator and the oscillator, and wherein the low-pass filter has a cut-off frequency higher than 200 kHz.

19. The system of claim 14, wherein the frequency of the reference signal is 13 MHz.

\* \* \* \* \*